(12) United States Patent
Mochizuki (10) Patent No.: US 7,566,604 B2
(45) Date of Patent: Jul. 28, 2009

(54) METHOD OF FABRICATING A DUAL-GATE STRUCTURE THAT PREVENTS CUT-THROUGH AND LOWERED MOBILITY

(75) Inventor: Marie Mochizuki, Kanagawa (JP)

(73) Assignee: Oki Semiconductor Co., Ltd., Tokyo (JP)

(*) Notice: Subject to any disclaimer, the term of this patent is extended or adjusted under 35 U.S.C. 154(b) by 221 days.

(21) Appl. No.: 11/727,290

(22) Filed: Mar. 26, 2007

(65) Prior Publication Data

US 2007/0173009 A1 Jul. 26, 2007

Related U.S. Application Data

(62) Division of application No. 10/449,491, filed on Jun. 2, 2003, now abandoned.

(51) Int. Cl.
*H01L 21/8234* (2006.01)

(52) U.S. Cl. .................. 438/198; 438/199; 438/216; 257/E21.637; 257/E21.639

(58) Field of Classification Search ............ 438/198, 438/199, 216; 257/E21.637, E21.639
See application file for complete search history.

(56) References Cited

U.S. PATENT DOCUMENTS

| | | | |
|---|---|---|---|
| 4,703,551 A | 11/1987 | Szluk et al. | |
| 5,960,289 A | 9/1999 | Tsui et al. | |
| 6,333,541 B1 | 12/2001 | Matsuoka et al. | |
| 6,436,771 B1 | 8/2002 | Jang et al. | |
| 6,528,858 B1 | 3/2003 | Yu et al. | |
| 6,576,512 B2 | 6/2003 | Taniguchi et al. | |
| 6,727,467 B1 | 4/2004 | Hadzizukic et al. | |
| 6,740,939 B2 | 5/2004 | Sayama et al. | |
| 6,750,532 B2 | 6/2004 | Rhee et al. | |
| 6,768,179 B2 | 7/2004 | Cho et al. | |
| 2003/0022445 A1 | 1/2003 | Taniguchi et al. | |
| 2004/0071030 A1 | 4/2004 | Goda et al. | |
| 2004/0217429 A1 | 11/2004 | Lin et al. | |
| 2005/0062099 A1 | 3/2005 | Yoshiyama et al. | |

FOREIGN PATENT DOCUMENTS

| | | |
|---|---|---|
| JP | 06-005796 | 1/1994 |
| JP | 11-008317 | 1/1999 |
| JP | 2000-114395 | 4/2000 |
| JP | 2001-274260 | 10/2001 |
| JP | 2001-291865 | 10/2001 |

*Primary Examiner*—Thanh V Pham
(74) *Attorney, Agent, or Firm*—Volentine & Whitt, P.L.L.C.

(57) ABSTRACT

A method of fabricating a dual-gate semiconductor device, including forming a first PMOS transistor on a semiconductor substrate, the first PMOS transistor having a first gate electrode and a first gate insulation layer; and forming a first NMOS transistor on the semiconductor substrate, the first NMOS transistor having a second gate electrode and a second gate insulation layer. The gate insulation layer of the first PMOS transistor is a silicon nitride oxide layer.

8 Claims, 10 Drawing Sheets

METHOD OF FABRICATING A DUAL-GATE STRUCTURE THAT PREVENTS CUT-THROUGH AND LOWERED MOBILITY

CROSS REFERENCE TO RELATED APPLICATION

This is a divisional application of application Ser. No. 10/449,491, filed on Jun. 2, 2003 now abandoned, which is hereby incorporated by reference in its entirety for all purposes.

TECHNICAL FIELD OF THE INVENTION

The present invention relates to a semiconductor device including a CMOS-transistor, and a fabrication method thereof.

BACKGROUND OF THE INVENTION

As described in Publication of Japanese Patent Application No. 2001-2986151, a conventional C-MOSFET uses the same material for the gate insulation layer of both a PMOSFET and an NMOSFET in order to simplify fabrication process. In recent years of deep-sub-micron generation, in order to reduce a short channel effect and to improve driving performance, an NMOSFET includes a gate electrode of N-type, while a PMOSFET includes a gate electrode of P-type, which is called "Dual-gate structure". In fabrication, an N-type impurity, such as phosphorus, is ion-implanted into an N-type poly-silicon gate electrode. On the other hand, a P-type impurity, such as boron, is ion-implanted into a P-type poly-silicon gate electrode.

However, in such fabricated PMOSFET, boron atomics may get out of the gate electrode through the gate insulation layer to the silicon substrate, which may be called "cut-through phenomenon". As a result, the threshold voltage (Vth) of the PMOSFET is changed in level, and the reliability of the device is decreased as shown in "Kurasawa et al., IEDM Tech. Digest, p. 895, 1993".

In order to prevent such cut-thorough phenomenon of boron, nitrogen may be added into the gate insulation layer. However, nitrogen atomics may be diffused to the interface between the silicon substrate and the gate insulation layer, so that the composition of nitrogen is increased adjacent the interface. When the composition of nitrogen is increased, fixed charge is generated in response to the composition of nitrogen. Such fixed charge lowers the flat band voltage of the MOSFET, and therefore, the threshold voltage of the NMOSFET is lowered and standby current is increased.

According to "S. Takagi et al., IEEE Trans. On Electron Device, Vol. 41, p. 2357, 1994", when the nitrogen composition is increased, electron mobility is reduced. Further, there are other problems in that a) the mobility of the MOSFET is decreased and mutual inductance is decreased, "H. Iwai et al., Symp. On VLSI Tech., p. 131, 1990; b) NBTI (Negative Bias Temperature Instability) is worsened; c) the lifetime of a transistor, used at an I/O portion with a higher power supply voltage, is shortened, N. Kimizuka et al., Symp. On VLSI Tech. Digest, p. 73, 1999.

In order to prevent the above described problems, according to an invention described in Publication of Japanese Patent Application No. H05-218405 and E. Hasegawa et al., IEDM Tech. Digest, p. 327, 1995, the nitrogen composition in the gate insulation layer is controlled to not be higher than 1 atom %. However, when the gate insulation layer is thinner in accordance with minuteness of transistors, the amount of nitrogen in the gate insulation layer is reduced. It becomes difficult to prevent the cut-through phenomenon of boron in a PMOSFET.

According to Publication of Japanese Patent Application No. 2001-291865, nitrogen concentration in a gate insulation layer is controlled not to be higher than $1 \times 10^{21}$ cm$^{-3}$, while the nitrogen concentration at the interface between the silicon substrate and the gate insulation layer is controlled not to be higher than $1 \times 10^{19}$ cm$^{-3}$. However, the fabrications steps are increased and mobility of an NMOSFET is still low.

OBJECTS OF THE INVENTION

Accordingly, it is an object of the present invention to provide a semiconductor device in which cut-through phenomenon of boron is prevented in a PMOS transistor.

Another object of the present invention to provide a semiconductor device, in which lower mobility of an NMOS transistor is prevented.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a method of fabricating a semiconductor device includes forming a first region and a second region in a substrate, the first region having p-type conductivity and the second region having n-type conductivity; forming a silicon oxide layer on the first and second regions; depositing a first polysilicon layer on an entirety of the silicon oxide layer; removing part of the first polysilicon layer so that the silicon oxide layer over the second region is exposed and so that a portion of the first polysilicon layer remains over the first region; forming a silicon nitride layer on the remaining first polysilicon layer; removing the silicon oxide layer from over the second region using the silicon nitride layer as a mask; forming a silicon nitride oxide layer on the substrate in the second region using the silicon nitride layer as a mask; depositing a second polysilicon layer over the first and second regions on the silicon nitride layer and on the silicon nitride oxide layer; removing part of the second polysilicon layer so that the silicon nitride layer is exposed above the first region and so that a portion of the second polysilicon layer remains over the second region; removing the silicon nitride layer; and patterning the silicon oxide layer, the remaining first polysilicon layer, the silicon nitride oxide layer and the remaining second polysilicon layer, to respectively form a first gate insulator and a first gate in the second region, and a second gate insulator and a second gate in the second region.

According to a second aspect of the invention, a method of fabricating a semiconductor device includes forming a first region and a second region in a substrate, the first region having p-type conductivity and the second region having n-type conductivity; forming a silicon nitride oxide layer on the first and second regions; removing part of the silicon nitride oxide layer so that the substrate is exposed at the first region and so that a portion of the silicon nitride oxide layer remains over the second region; forming a silicon oxide layer on the exposed substrate at the first region; depositing a polysilicon layer over an entirety of the first and second regions on the silicon oxide layer and on the remaining silicon nitride oxide layer; and patterning the silicon oxide layer, the remaining silicon nitride oxide layer and the polysilicon layer, to respectively form a first gate insulator and a first gate in the first region, and a second gate insulator and a second gate in the second region.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present invention. The following detailed description is, therefore, not to be taken in a limiting sense, and scope of the present invention is to be defined only by the appended claims.

Figure 1:
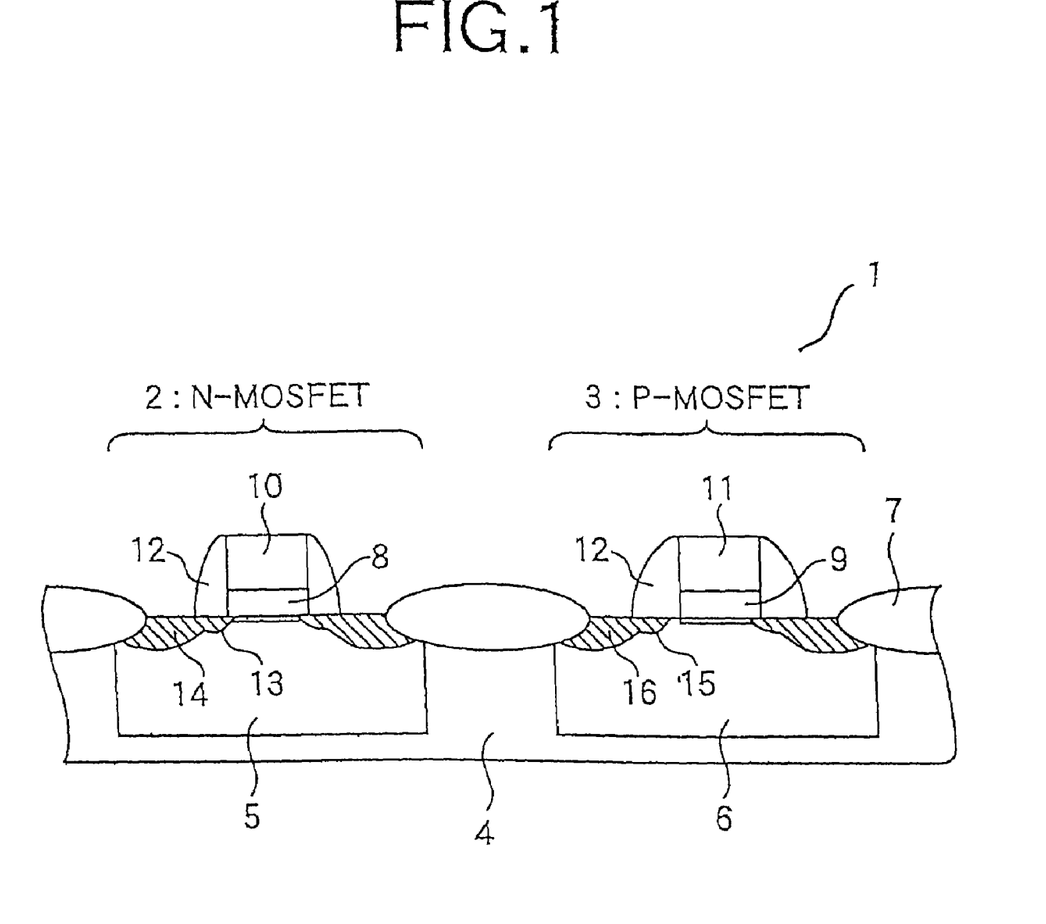
FIG. 1 is a cross-sectional view showing a semiconductor device according to a first preferred embodiment of the present invention.

FIG. 1 is a cross-sectional view showing a semiconductor device according to a first preferred embodiment of the present invention. A C-MOSFET 1 includes an N-MOSFET 2 and a P-MOSFET 3 on the same silicon substrate 4. In the silicon substrate 4, an N-channel region 5 and a P-channel region 6 are formed and electrically separated from each other by a field oxide layer 7. Over the N-channel region 5, a gate insulator 8 of a silicon oxide layer for the N-MOSFET 2 is formed on the silicon substrate 4. On the other hand, over the P-channel region 6, a gate insulator 9 of a silicon nitride oxide layer for the P-MOSFET 3 is formed on the silicon substrate 4.

A gate electrode 10 of polysilicon is formed on the gate insulator 8 for the N-MOSFET 2, while a gate electrode 11 of polysilicon is formed on the gate insulator 9 for the P-MOSFET 3. An N-type of impurity, such as phosphorus, is added into the gate electrode 10 of the N-MOSFET 2, while a P-type of impurity, such as boron, is added into the gate electrode 11 of the N-MOSFET 3. Each of the gate electrodes 10 and 11 is provided with sidewalls of oxide silicon thereon.

In the N-MOSFET 2, an N-type LDD (Lightly Doped Drain) region 13 and source/drain regions 14 are formed below the gate electrode 10. In the P-MOSFET 3, a P-type LDD (Lightly Doped Drain) region 15 and source/drain regions 16 are formed below the gate electrode 11.

According to the first preferred embodiment, a cut-through phenomenon of boron can be prevented in the P-MOSFET 3, so that variation of the threshold voltage is prevented. Further, the flat band voltage of the N-MOSFET 2 can be prevented from being lowered, so that the substrate concentration in the N-channel region 5 of the N-MOSFET 2 is decreased. Therefore, it can be prevented to lower driving performance (drain current) of the N-MOSFET 2.

Figure 2:
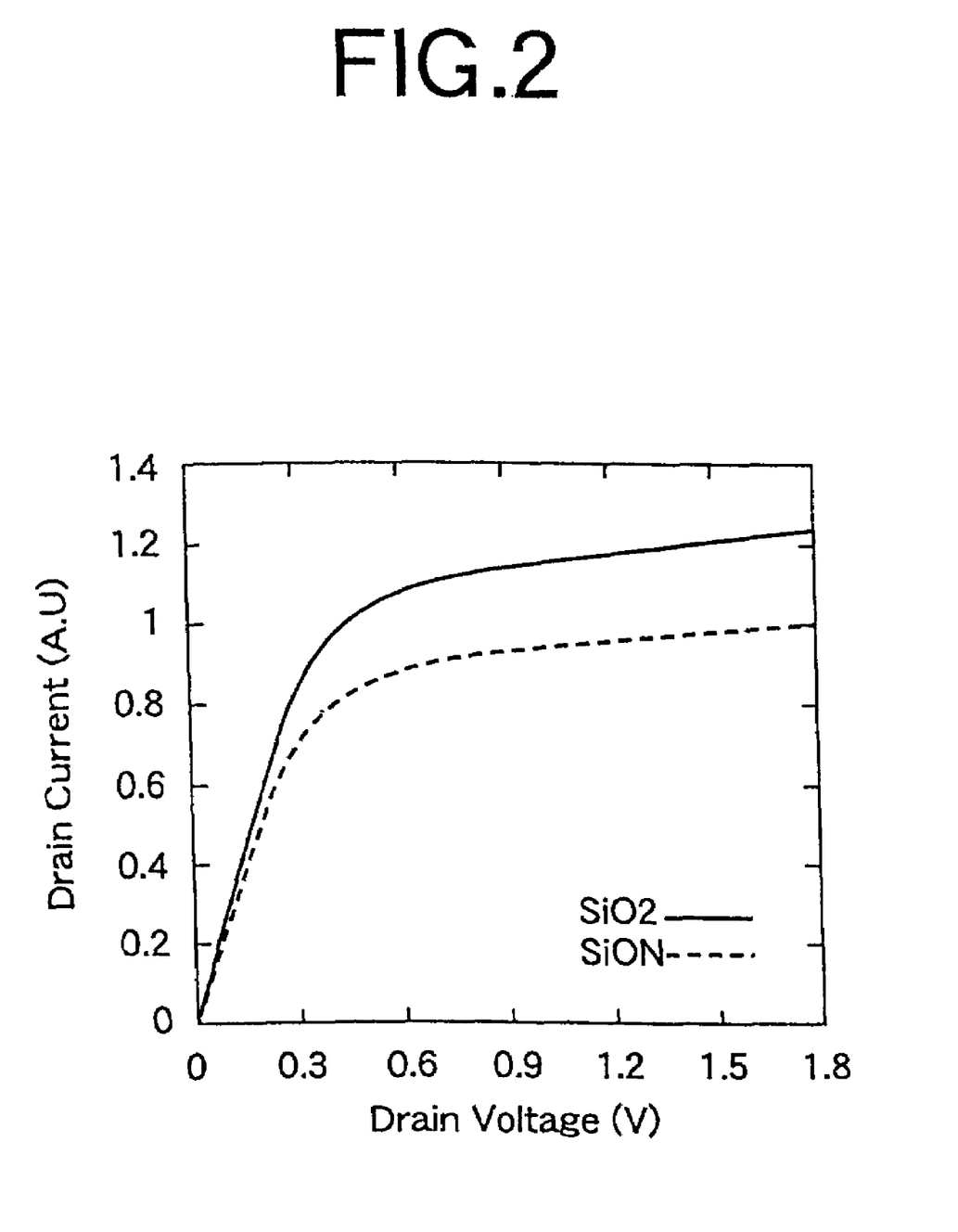
FIG. 2 is a graph showing a characteristic of the first preferred embodiment.

FIG. 2 is a graph showing the relation between drain voltage and drain current of an N-MOSFET for different materials of gate insulator. When a gate insulator of silicon oxide layer is used, the driving performance is increased about 24% as compared with a gate insulator of silicon nitride oxide layer.

Figure 3A:
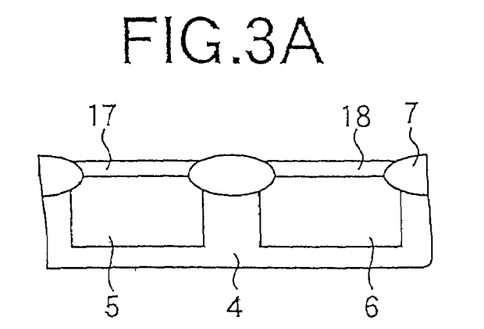
FIGS. 3A to 3G are cross-sectional views showing fabricating steps of the semiconductor device according to the first preferred embodiment.

FIGS. 3A to 3G are cross-sectional views showing fabricating steps of the semiconductor device according to the first preferred embodiment, shown in FIG. 1. First, an N-channel region 5, a P-channel region 6 and a field oxide layer 7 are formed on a silicon substrate 4. Next, in order to control a threshold voltage, an impurity, such as boron or $BF_2$, is implanted into the N-channel region 5, while an impurity, such as arsenic or phosphorus, is implanted into the P-channel region 6. As shown in FIG. 3A, the surface of the silicon substrate 4 is oxidized to form a gate insulator 17 having a thickness of 2.5 nm.

Figure 3B:
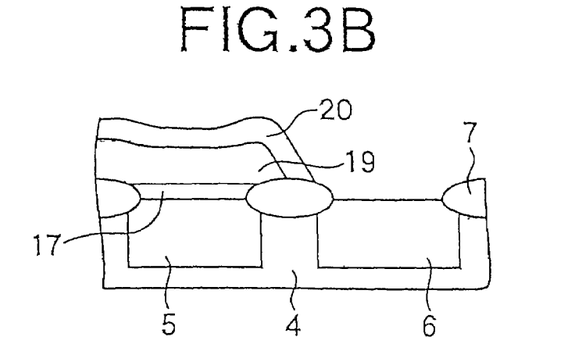

Next, a polysilicon layer 19 is deposited on the entire surface of the silicon substrate 4, then a gate impurity, for example, arsenic or phosphorus, of $2 \times 10^{15}$ cm$^{-3}$ is ion-implanted. After that, the polysilicon layer 19 formed on the P-channel region 6 is removed by a photolithographic process so as that the remaining polysilicon layer 19 has a 60-degree taper portion at an edge thereof. Next, a silicon nitride layer 20 is deposited on the polysilicon layer 19, then the silicon nitride layer formed on the P-channel region 6 is removed. At this time, the polysilicon layer 19 on the N-channel region 5 is completely covered with the silicon nitride layer 20. The silicon oxide layer 18 on the P-channel region 6 is removed using the silicon nitride layer 20 as a mask, as shown in FIG. 3B.

Figure 3C:
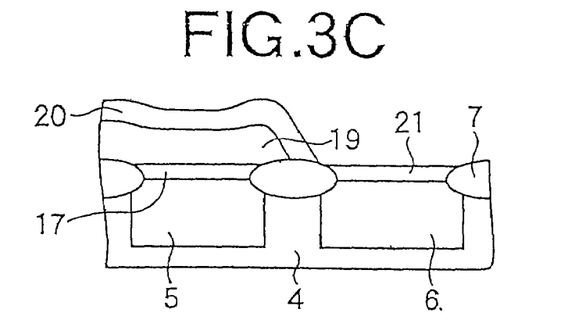

Using the polysilicon layer 19 and the silicon nitride layer 20 as a mask, the P-channel region 6 is treated in an oxidizing atmosphere at 750° C. to 850° C., and then treated in an NO (Nitriding-Oxidizing) atmosphere at 900° C. for forty minutes to form a silicon nitride oxide layer 21 having a thickness of 2.5 nm on the P-channel region 6, as shown in FIG. 3C. A silicon oxide layer can be used as a mask instead of the silicon nitride layer 20. The gate insulators of the N-MOSFET and PMOSFET may have the different thickness from each other.

Figure 3D:
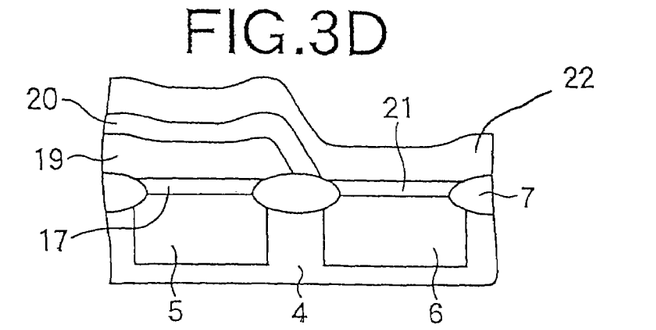
Figure 3E:
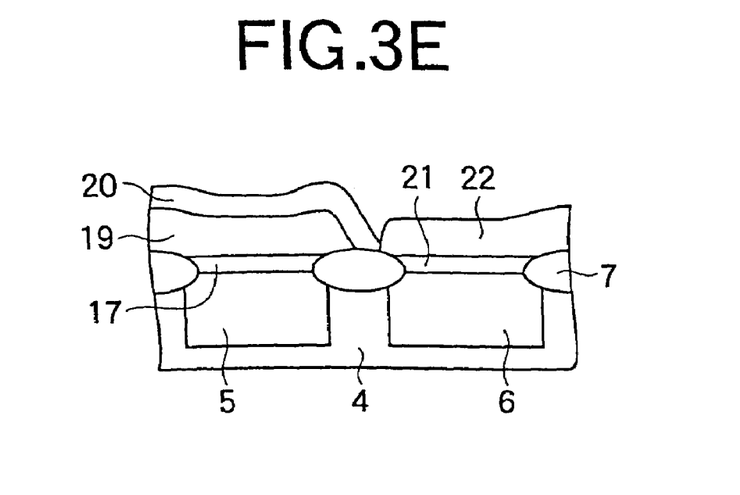
Figure 3F:
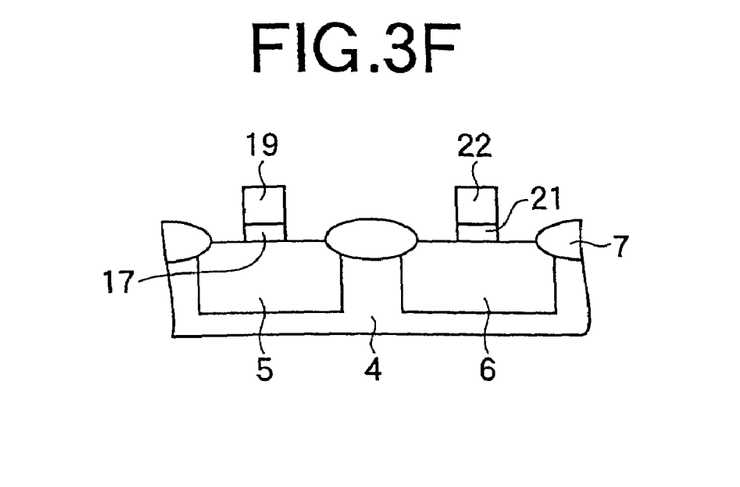

Next, a polysilicon layer 22 is formed over the entire surface of the substrate, as shown in FIG. 3D. After that, the polysilicon layer 22, formed on the N-channel region 5, is removed using a photolithographic technique, as shown in FIG. 3E. Subsequently, the silicon nitride layer 20 is removed, and gate electrodes are shaped using a patterning technique, as shown in FIG. 3F.

Figure 3G:
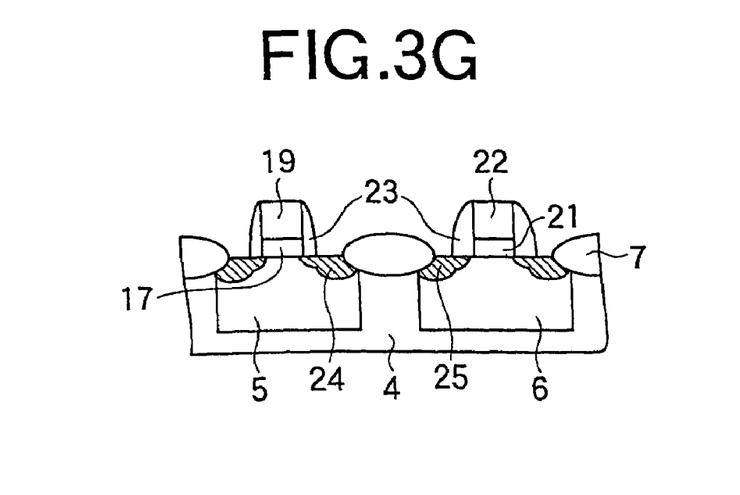

Next, sidewall layers 23 are formed on side surfaces of the gate electrodes. After that, boron or $BF_2$ is ion-implanted into the N-channel region 5 to form N-type LDD and source-drain regions 24 in the N-channel region 5. On the other hand, arsenic or phosphorus is ion-implanted into the P-channel region 6 to form a P-type LDD and source-drain regions 25 in the P-channel region 6. A C-MOSFET is completed, as shown in FIG. 3G.

According to the above-described fabrication steps, a silicon nitride oxide layer is formed as a gate insulator of the P-MOSFET region, however, a silicon oxide layer, which is a gate insulator of the N-MOSFET region, is not put in an NO atmosphere. As a result, the gate insulator of the P-MOSFET is a silicon oxide nitride layer, therefore, such a gate insulator prevents a cut-through phenomenon of boron. Further, the gate insulator of the N-MOSFET is of a silicon oxide layer, so that the mobility of the transistor is not decreased and driving performance is expected to improve.

Figure 4A:
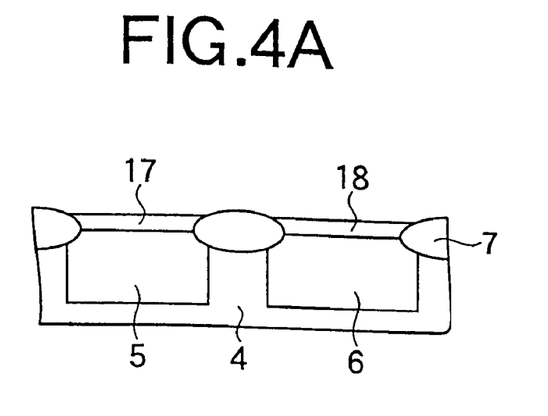
FIGS. 4A to 4F are cross-sectional views showing fabricating steps of the semiconductor device according to the first preferred embodiment.

FIGS. 4A to 4F are cross-sectional views showing another type of fabricating steps of the semiconductor device according to the first preferred embodiment, shown in FIG. 1. First, an N-channel region 5, a P-channel region 6 and a field oxide layer 7 are formed on a silicon substrate 4. Next, in order to control a threshold voltage, an impurity, such as boron or $BF_2$, is implanted into the N-channel region 5, while an impurity, such as arsenic or phosphorus, is implanted into the P-channel region 6. After that, the entire surface of the silicon substrate 4 is oxidized and the substrate is treated in an NO atmosphere at 900° C. to form a gate insulator 17, as shown in FIG. 4A.

Figure 4B:
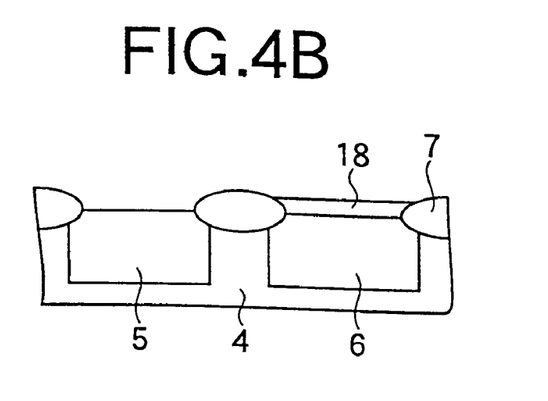
Figure 4C:
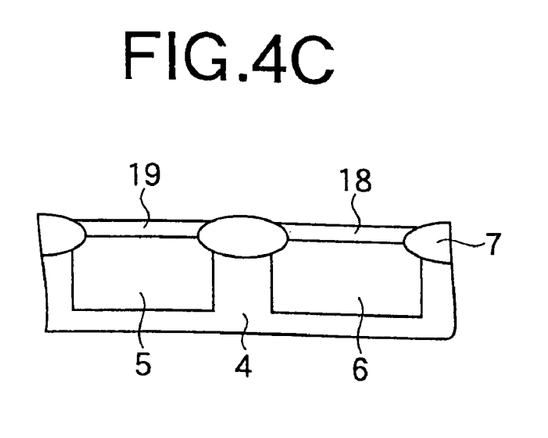

Next, the silicon nitride oxide layer 17 on the N-channel region 5 is removed by a photolithographic technique, as shown in FIG. 4B. After that, the substrate is again oxidized to form a silicon oxide layer 19 as a gate insulator on the N-channel region 5, as shown in FIG. 4C. In this process, the gate insulator 18 on the P-MOSFET region 6 is also re-oxidized to increase the thickness thereof. In order to form the gate insulator on the N-MOSFET region 5 having the same thickness as the gate insulator on the P-MOSFET 6, the thickness of the silicon nitride oxide layer 18 in the PMOSFET would be reduced.

Figure 4D:
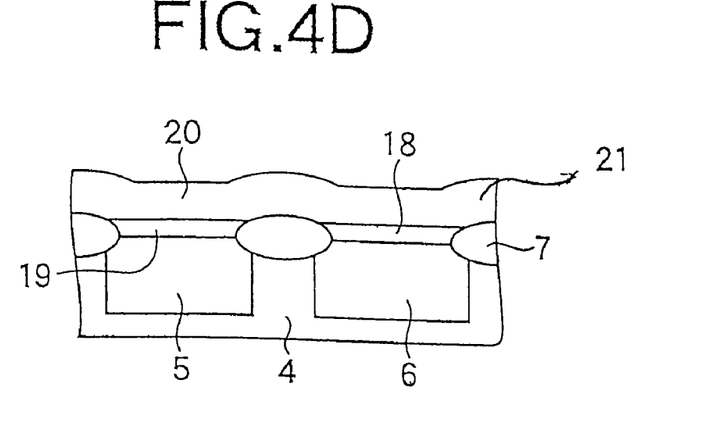
Figure 4E:
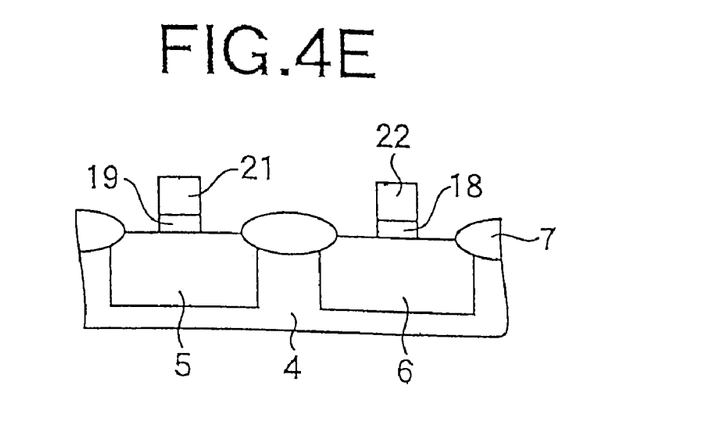

Next, a polysilicon layer 21 is deposited on the entire surface of the silicon substrate 4, then a gate impurity, for example, arsenic or phosphorus, of $2 \times 10^{15}$ cm$^{-3}$ is ion-implanted into the polysilicon layer on the N-channel region, as shown in FIG. 4D. After that, gate electrodes are shaped using a patterning technique, as shown in FIG. 4E.

Figure 4F:
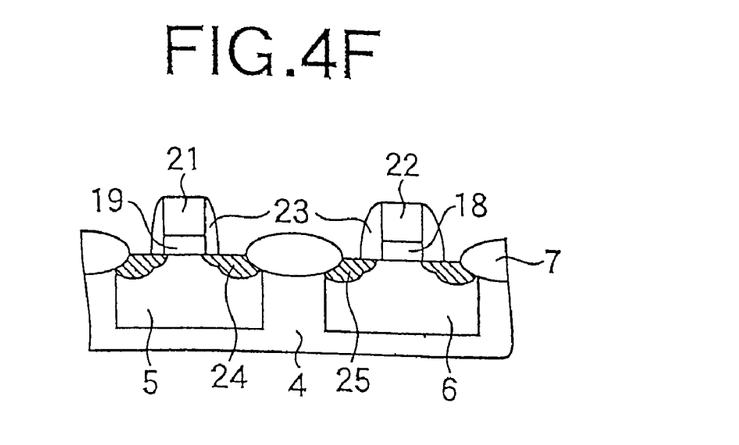

Next, sidewall layers 23 are formed on side surfaces of the gate electrodes. Subsequently, boron or $BF_2$ is ion-implanted into the N-channel region 5 to form N-type LDD and source-drain regions 24 in the N-channel region 5. On the other hand, arsenic or phosphorus is ion-implanted into the P-channel region 6 to form P-type LDD and source-drain regions 25 in the P-channel region 6. A C-MOSFET is completed, as shown in FIG. 4F.

According to the above-described fabrication steps, the silicon nitride oxide layer 17 is formed on the entire surface of the silicon substrate 4, and then the silicon nitride oxide layer in the N-MOSFET 5 is removed. The substrate is again oxidized to form a silicon oxide layer in the N-MOSFET region 5. As a result, the gate insulator of the P-MOSFET 6 prevents a cut-through phenomenon of boron. Further, the gate insulator of the NMOSFET is of a silicon oxide layer, so that the mobility of the transistor is not decreased and driving performance is expected to improve.

Figure 5:
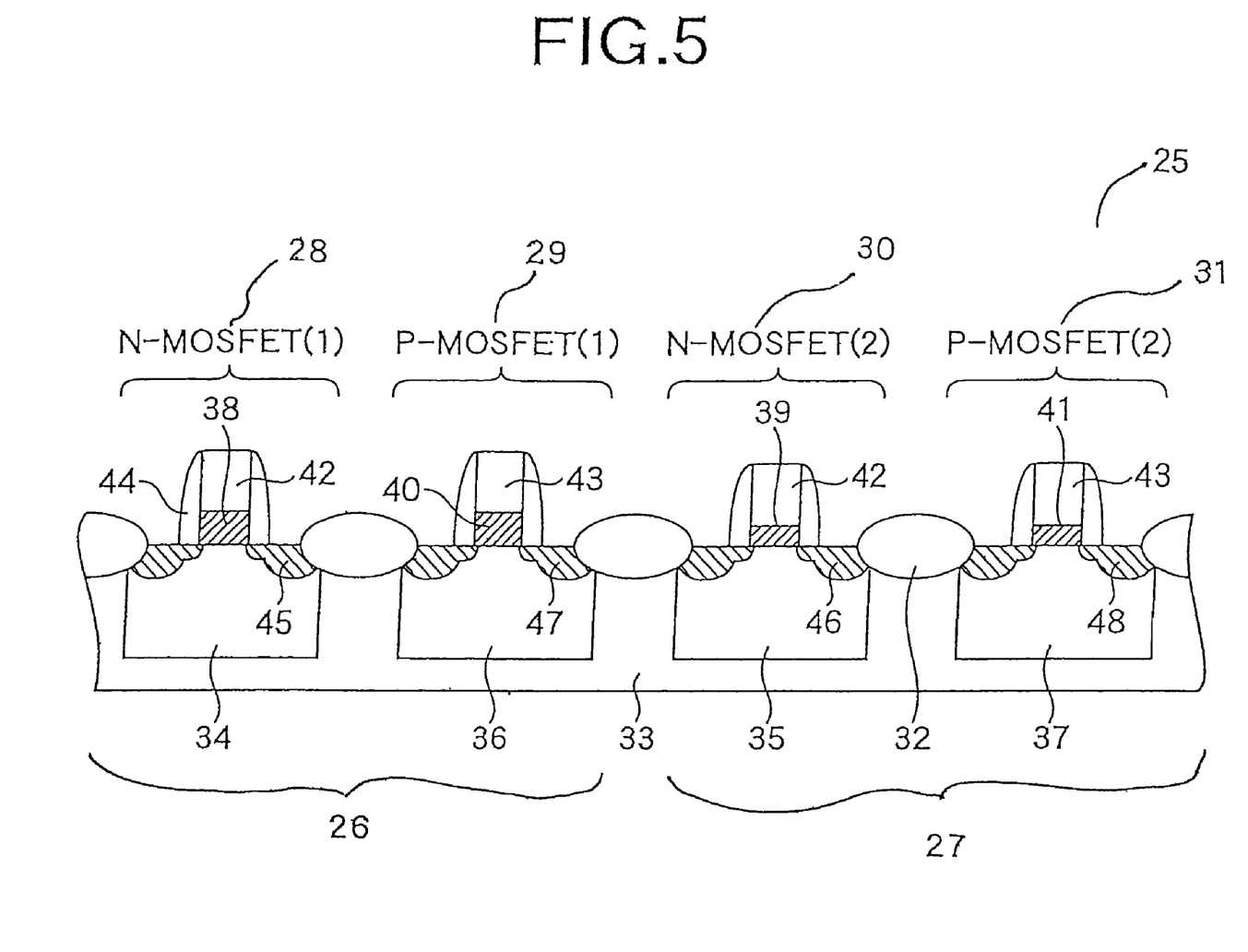
FIG. 5 is a cross-sectional view showing a semiconductor device according to a second preferred embodiment of the present invention.

FIG. 5 is a cross-sectional view showing a semiconductor device according to a second preferred embodiment of the present invention. In this embodiment, a C-MOSFET 25 includes a first P-MOSFET 29 having a gate insulator of silicon oxide layer having a thickness of more than 4 nm, and a second P-MOSFET 31 having a gate insulator of silicon oxide nitride layer having a thickness not more than 4 nm. The C-MOSFET 25 is composed of a thick-layer MOSFET 26, including gate insulators having a thickness not less than 4 nm, and a thin-layer MOSFET 27, including gate insulators having a thickness not more than 4 nm. The MOSFET 26 includes a first N-MOSFET 28 and the first P-MOSFET 29. The MOSFET 27 includes a second N-MOSFET 30 and the second P-MOSFET 31.

The MOSFETs 28, 29, 30 and 31 are electrically separated from each other by a field oxide layer 32. On a silicon substrate 33, a first N-channel region 34 and a second N-channel region 35 are formed. The concentrations of those N-channel regions 34 and 35 may be the same or may be different from each other. In the first N-channel region 34, a gate insulator 38 of a silicon nitride oxide layer is formed for the first N-MOSFET 28. In the second N-channel region 35, a gate insulator 39 of a silicon nitride oxide layer is formed for the second N-MOSFET 30. In the first P-channel region 36, a gate insulator 40 of a silicon oxide layer is formed for the first P-MOSFET 29. In the second P-channel region 37, a gate insulator 41 of a silicon nitride oxide layer is formed for the second P-MOSFET 31.

On the gate insulator 38 of the first N-MOSFET 28, gate electrode 42 of polysilicon has an N-type impurity, such as phosphorus, implanted therein. On the gate insulator 39 of the second N-MOSFET 30, a gate electrode 42 of polysilicon has an N-type impurity, such as phosphorus, implanted therein. On the gate insulator 40 of the first P-MOSFET 29, a gate electrode 43 of polysilicon has a P-type impurity, such as boron, implanted therein. On the gate insulator 41 of the second P-MOSFET 31, a gate electrode 43 of polysilicon has a P-type impurity, such as boron, implanted therein.

Each gate electrode is provided with a sidewall 44 of oxide silicon thereon. In the first and second N-MOSFETs 28 and 30, an N-type LDD (Lightly Doped Drain) regions and source/drain regions 45 and 46 are formed below the gate electrodes. The concentration of the LDD and the source-drain regions may be the same or different from each other. In the first and second P-MOSFETs 29 and 31, P-type LDD (Lightly Doped Drain) regions and source/drain regions 47 and 48 are formed below the gate electrodes. The concentration of the LDD and the source-drain regions may be the same or different from each other.

According to the second preferred embodiment, a cut-through phenomenon of boron can be prevented in the P-MOSFET 31, having a gate insulator of not thicker than 4 nm. Further, NBTI can be prevented from being increased in the P-MOSFET 29, having a gate insulator of not thinner than 4 nm. Especially, the present invention is useful to improve reliability of a P-MOSFET used at an I/O portion with a higher power supply voltage, and to extend a lifetime of the device.

Figure 6:
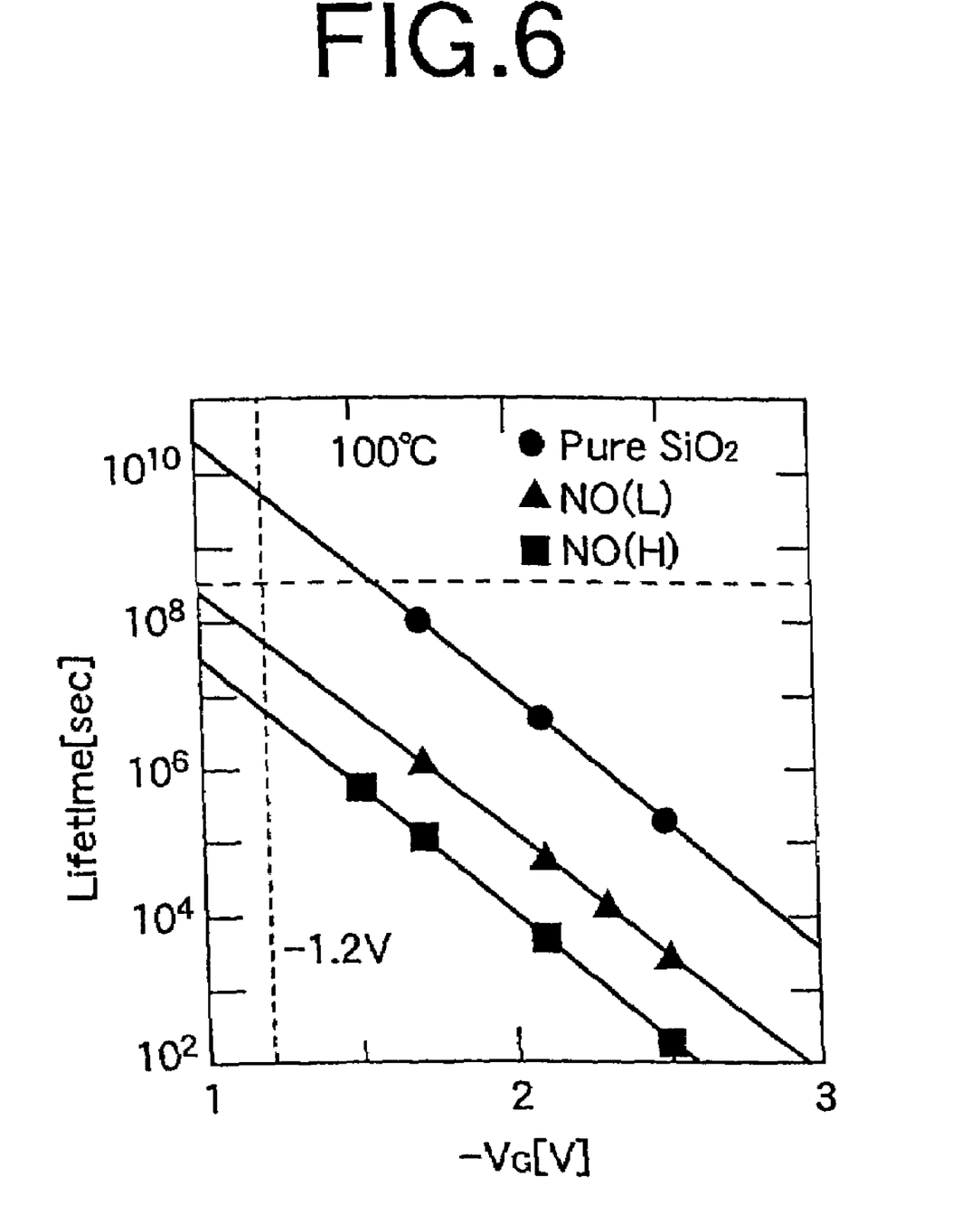
FIG. 6 is a graph showing a characteristic of the second preferred embodiment.

FIG. 6 is a graph showing a characteristic of the second preferred embodiment, which is the stress voltage dependence on the device lifetime. In the graph, lifetimes are compared between a P-MOSFET using a gate insulator of silicon nitride oxide layer and a P-MOSFET using a gate insulator of silicon oxide layer. It can be understood from the graph, the lifetime is longer when a P-MOSFET uses a gate insulator of silicon oxide layer as compared to a P-MOSFET using a gate insulator of silicon nitride oxide layer.

In a modification of the second preferred embodiment, the first P-MOSFET 29 may employ a silicon oxide layer as a gate insulator of not thinner than 4 nm, and each of the first N-MOSFET 28 and the second N-MOSFET 30 may employ a silicon oxide layer as a gate insulator.

According to the second preferred embodiment, a cut-through phenomenon of boron can be prevented in the P-MOSFET 31, having a gate insulator of not thicker than 4 nm. Further, flat band voltages of the N-MOSFETs 28 and 30 can be prevented from decreasing, and substrate concentration of the N-channel regions 34 and 35 can be reduced. As a result, driving performance (amount of drain current) may be maintained high. Still further, NBTI can be prevented from being increased in the P-MOSFET 29, having a gate insulator of not thinner than 4 nm. Therefore, it is expected to extend a lifetime of the device.

Figure 7A:
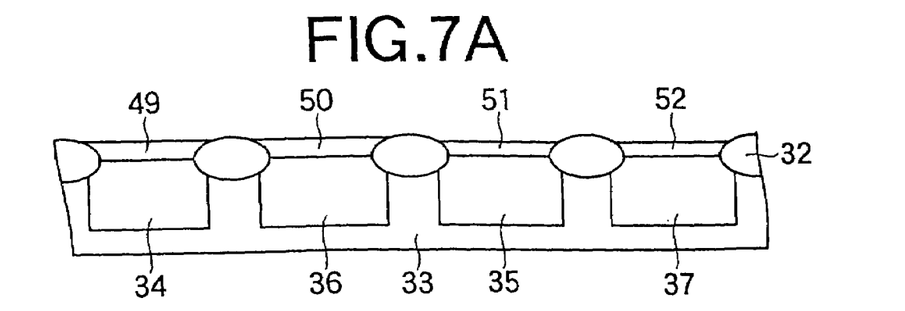
FIGS. 7A to 7G are cross-sectional views showing fabricating steps of the semiconductor device according to the second preferred embodiment.

FIGS. 7A to 7G are cross-sectional views showing fabricating steps of the semiconductor device according to the modification of the second preferred embodiment, described with respect to FIG. 5. In fabrication, first and second N-channel regions 34 and 35, first and second P-channel regions 36 and 37 and a field oxide layer 32 are formed on a silicon substrate 33. Next, in order to control a threshold voltage, an impurity, such as boron or $BF_2$, is implanted into the first and second N-channel regions 34 and 35, while an impurity, such as arsenic or phosphorus, is implanted into the first and second P-channel regions 36 and 37. Subsequently, the entire surface of the silicon substrate 33 is oxidized to form an oxide layer having a thickness of 6 nm thereon. After that, the silicon oxide layer on the second N-channel region 35 and the second P-channel region 37 is removed, and the substrate 33 is oxidized again to form silicon oxide layers 49 and 50 having a thickness of 7 nm on the first N-channel region 34 and the first P-channel region 36, respectively, and to form silicon oxide layers 51 and 52 having a thickness of 2.5 nm on the second N-channel region 35 and the second P-channel region 37, respectively, as shown in FIG. 7A.

Figure 7B:
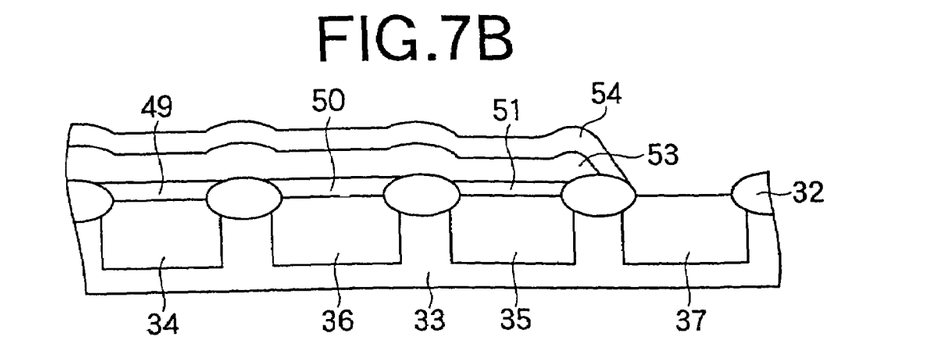

Next, a poly-silicon 53 is deposited on the first and second N-channel regions 34 and 35 and the first P-channel region 36, then the silicon oxide layer 52 on the P-channel region 37 is removed using a nitride layer 54 as a mask, as shown in FIG. 7B.

Figure 7C:
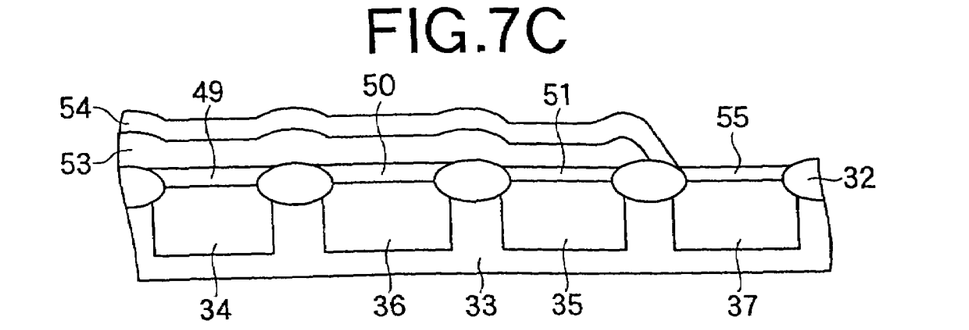

After that, boron or $BF_2$ is added into the polysilicon layer 53 on the first P-channel region 36, while arsenic or phosphorus is added into polysilicon layer 53 on the first and second N-channel regions 34 and 35. In the same manner shown in FIG. 3C, a silicon nitride oxide layer 55 is formed on the second P-channel region 37 to have a thickness of 2.5 nm, as shown in FIG. 7C.

Figure 7D:
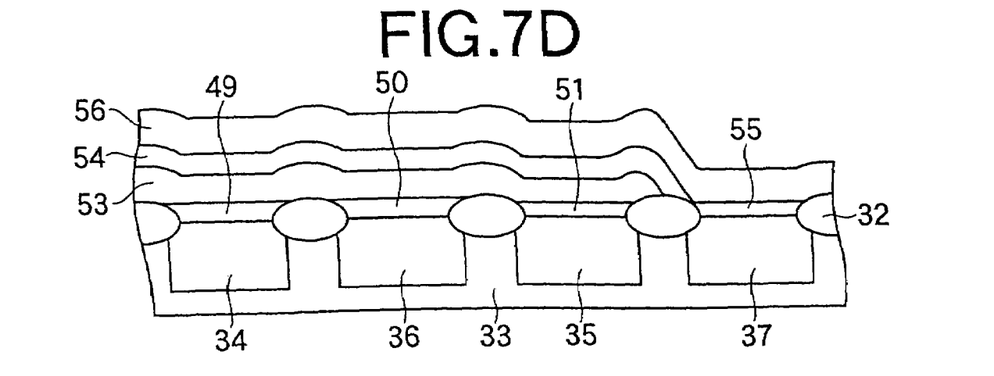
Figure 7E:
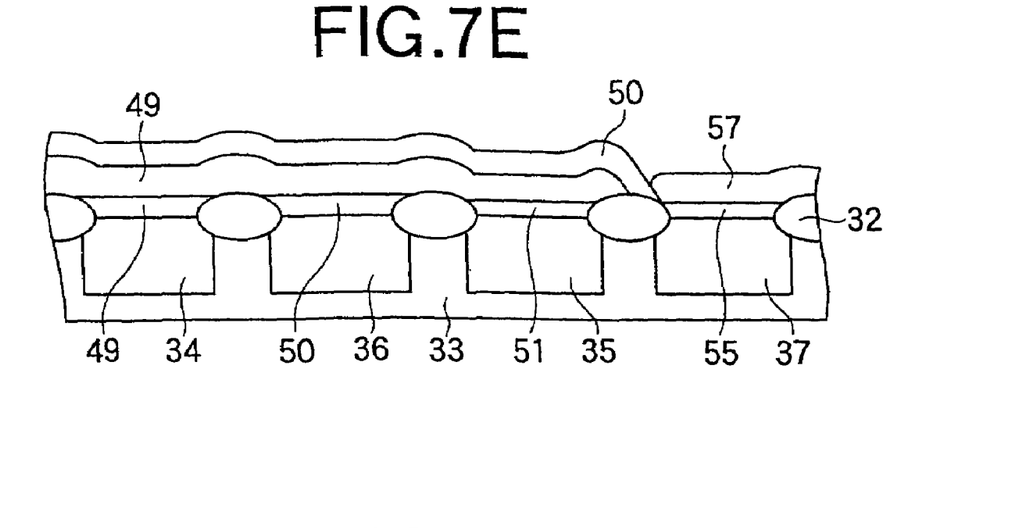
Figure 7F:
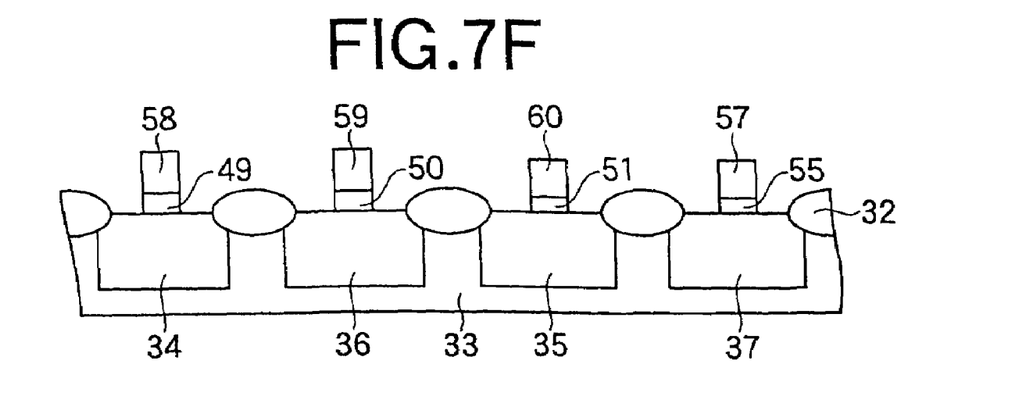

Next, a polysilicon layer 56 is deposited over the entire surface of the substrate, as shown in FIG. 7D. After that, the polysilicon layer 56 formed on the first and second N-channel regions 34 and 35 and the first P-channel region 36 is removed by a photolithographic technique, as shown in FIG. 7E, so that polysilicon 57 remains over second P-channel region 37. Subsequently, the silicon nitride layer 54 is removed, and gate electrodes are shaped by a patterning process, as shown in FIG. 7F.

Figure 7G:
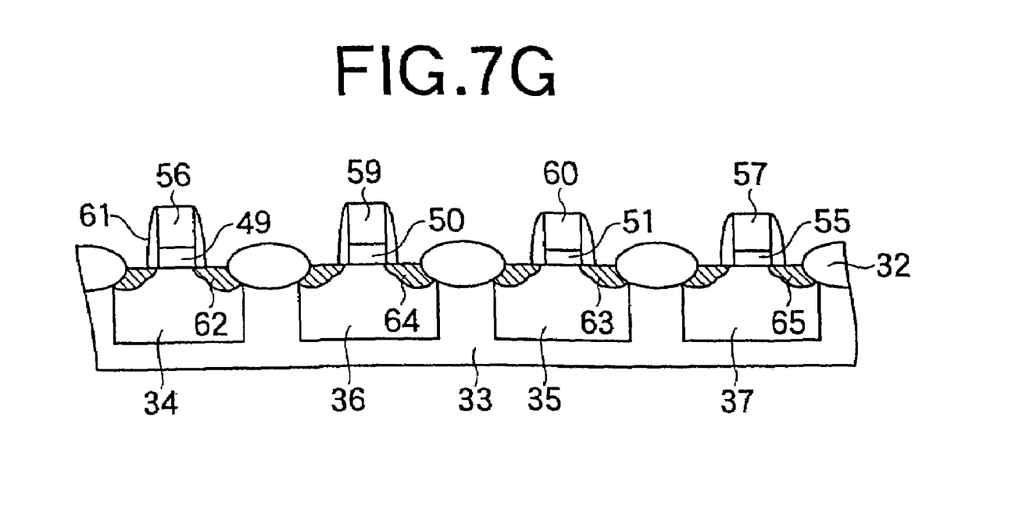

After that, sidewall layers 61 are formed on side surfaces of the gate electrodes. After that, boron or $BF_2$ is ion-implanted into the first and second N-channel regions 34 and 35 to form N-type LDD and source-drain regions 62 and 63. On the other hand, arsenic or phosphorus is ion-implanted into the first and second P-channel regions 36 and 37 to form P-type LDD and source-drain regions 64 and 65. A C-MOSFET is completed, as shown in FIG. 7G.

According to the above-described fabrication steps, a silicon nitride oxide layer having a thickness of not more than 4 nm is formed as a gate insulator only of the second P-MOSFET 31, however, the silicon oxide layers (gate insulators) of the first and second N-MOSFETs 28 and 30 and the first P-MOSFET 29 are not nitrided. The gate insulator having a thickness of not more than 4 nm of the second P-MOSFET 31 is of a silicon oxide nitride layer, therefore, such a gate insulator prevents a cut-through phenomenon of boron. Further, the gate insulators of the first N-MOSFET 28 and the second N-MOSFET 30 are of silicon oxide layers, so that the mobility of the transistor is not decreased and driving performance is expected to improve. Still further, the first P-MOSFET having a thicker gate insulator of thicker than 4 nm is made of a silicon oxide layer, so that NBTI can be prevented from being increased.

What is claimed is:

1. A method of fabricating a semiconductor comprising:
   forming a first region and a second region in a substrate, the first region having p-type conductivity and the second region having n-type conductivity;
   forming a silicon oxide layer on the first and second regions;
   depositing a first polysilicon layer on an entirety of the silicon oxide layer;
   removing part of the first polysilicon layer so that the silicon oxide layer over the second region is exposed and so that a portion of the first polysilicon layer remains over the first region;
   forming a silicon nitride layer on the remaining first polysilicon layer;
   removing the silicon oxide layer from over the second region using the silicon nitride layer as a mask;
   forming a silicon nitride oxide layer on the substrate in the second region using the silicon nitride layer as a mask;
   depositing a second polysilicon layer over the first and second regions on the silicon nitride layer and on the silicon nitride oxide layer;
   removing part of the second polysilicon layer so that the silicon nitride layer is exposed above the first region and so that a portion of the second polysilicon layer remains over the second region;
   removing the silicon nitride layer; and
   patterning the silicon oxide layer, the remaining first polysilicon layer, the silicon nitride oxide layer and the remaining second polysilicon layer, to respectively form a first gate insulator and a first gate in the second region, and a second gate insulator and a second gate in the second region.

2. The method of fabricating a semiconductor device of claim 1, further comprising:
   implanting source and drain regions of n-type conductivity adjacent the first gate, to form an NMOS transistor in the first region; and
   implanting source and drains regions of p-type conductivity adjacent the second gate, to form a PMOS transistor in the second region.

3. The method of fabricating a semiconductor device of claim 2, further comprising implanting impurities into the substrate at the first and second regions prior to said forming a silicon oxide layer, to control threshold voltages of the NMOS and PMOS transistors.

4. The method of fabricating a semiconductor device of claim 1, wherein a thickness of the silicon oxide layer and a thickness of the silicon nitride oxide layer are the same.

5. The method of fabricating a semiconductor device of claim 1, wherein a thickness of the silicon oxide layer and a thickness of the silicon nitride oxide layer are different.

6. The method of fabricating a semiconductor device of claim 1, wherein the silicon oxide layer and the silicon nitride oxide layer are 2.5 nm thick.

7. The method of fabricating a semiconductor device of claim 1, wherein the remaining first polysilicon layer has a 60 degree taper at an edge thereof.

8. The method of fabricating a semiconductor device of claim 1, further comprising implanting an impurity into the first polysilicon layer prior to said removing the first polysilicon layer.

* * * * *